(12) United States Patent
Lu et al.

(10) Patent No.: US 7,705,691 B2
(45) Date of Patent: Apr. 27, 2010

(54) CAPACITOR INTERCONNECTION

(75) Inventors: Chee Wai Albert Lu, Singapore (MY);
Boon Keng Lok, Singapore (MY); Chee Khuen Stephen Wong, Singapore (SG); Kai Meng Chua, Singapore (SG); Lai Lai Wai, Singapore (SG); Sunnappan Vasudivan, Singapore (SG)

(73) Assignee: Agency for Science, Technology & Research, Centros (SG)

( * ) Notice: Subject to any disclaimer, the term of this patent is extended or adjusted under 35 U.S.C. 154(b) by 0 days.

(21) Appl. No.: 11/253,039

(22) Filed: Oct. 18, 2005

(65) Prior Publication Data

US 2007/0085200 A1 Apr. 19, 2007

(51) Int. Cl.
*H01L 23/48* (2006.01)
*H05L 1/11* (2006.01)
*H04B 3/28* (2006.01)

(52) U.S. Cl. .................. 333/12; 361/794; 257/750

(58) Field of Classification Search ............ 333/12; 361/794; 257/750
See application file for complete search history.

(56) References Cited

U.S. PATENT DOCUMENTS

| | | | |
|---|---|---|---|
| 5,338,975 A * | 8/1994 | Cole et al. | 257/750 |
| 5,347,258 A | 9/1994 | Howard et al. | |
| 5,428,506 A * | 6/1995 | Brown et al. | 361/794 |
| 5,603,847 A | 2/1997 | Howard et al. | |
| 5,766,670 A | 6/1998 | Arldt et al. | |
| 6,114,997 A | 9/2000 | Lee et al. | |
| 6,407,929 B1 | 6/2002 | Hale et al. | |
| 6,441,313 B1 | 8/2002 | Novak | |
| 6,606,793 B1 | 8/2003 | Dunn | |
| 6,674,338 B2 | 1/2004 | Novak | |
| 6,727,780 B2 | 4/2004 | Novak et al. | |
| 6,737,749 B2 | 5/2004 | Tomsio et al. | |
| 6,798,666 B1 * | 9/2004 | Alexander et al. | 361/766 |
| 6,870,436 B2 | 3/2005 | Grebenkemper | |
| 6,873,219 B2 * | 3/2005 | Grebenkemper | 333/12 |
| 7,275,222 B2 | 9/2007 | Douriet | |
| 7,288,723 B2 * | 10/2007 | Welbon et al. | 174/255 |
| 2004/0196112 A1 * | 10/2004 | Welbon et al. | 333/1 |

FOREIGN PATENT DOCUMENTS

| | | |
|---|---|---|
| WO | WO 01/199479 | 12/2001 |
| WO | WO 02/41673 | 5/2002 |

* cited by examiner

*Primary Examiner*—Howard Weiss
*Assistant Examiner*—Steven H Rao

(57) ABSTRACT

A substrate for power decoupling and a method of forming a substrate for power decoupling. The substrate comprises one or more decoupling capacitors; and one or more interconnections to the decoupling capacitors. At least one of the interconnections comprises a lossy material.

20 Claims, 8 Drawing Sheets

CAPACITOR INTERCONNECTION

FIELD OF INVENTION

The present invention relates broadly to a substrate for power decoupling, and to a method of forming a substrate for power decoupling.

BACKGROUND

In design optimization and implementation of discrete capacitors for power decoupling in electronic appliances and systems, series resistance to a discrete or embedded decoupling capacitor is typically provided by using an annular ring of resistive material printed or formed around the capture pad of vias connected to the discrete decoupling capacitor. The decoupling capacitor is thus connected through a series resistor to the power planes. This design has a number of drawbacks, including:

- The gap between the vias interconnecting the decoupling capacitor is determined by the diameter of the annular ring, thereby increasing via pitch for the decoupling capacitor interconnection.
- The gap between the vias interconnecting the decoupling capacitor is determined by the diameter of the annular ring, limiting the via coupling effect and thereby actually increasing the effective inductance of the decoupling capacitor interconnection and degrading the power decoupling performance.
- The series resistance between the decoupling capacitor and power planes is provided through a lateral interconnection that inhibits direct interconnection between active devices and decoupling capacitor, resulting in additional loop inductance between the decoupling capacitor and active device, and also degrading signal routability.
- The series resistance employed using resistive materials on the power planes affects the effective resistance at dc or low frequency for high current path, degrading electrical performance, especially for high power devices
- The series resistance employed using resistive materials on the power planes also introduces additional thermal resistance due to intrinsic thermal properties of resistive materials. Power planes are inherently lateral thermal conducting paths that provide heat dissipation from active devices.

A need therefore exists for a decoupling capacitor interconnection design and method that addresses one or more of the above mentioned drawbacks.

SUMMARY

In accordance with a first aspect of the present invention there is provided a substrate for power decoupling, comprising one or more decoupling capacitors; and one or more interconnections to the decoupling capacitors, at least one of the interconnections comprising a lossy material.

One or more of the interconnections may comprise different segments made from lossy and conductive materials.

The different segments may be connected in series.

The interconnections may comprise vertical vias.

The substrate may further comprise an active device mounted on a surface of the substrate, and each vertical via may interconnect directly to respective decoupling capacitors and the active device.

One or more of the interconnections may be directly connected to a power plane of the substrate.

One or more of the interconnections may be directly connected to a ground plane of the substrate.

The interconnections may be isolated from a power plane of the substrate.

Each decoupling capacitor may comprise a surface mounted discrete capacitor or an embedded discrete capacitor.

The substrate may further comprise one or more embedded integral capacitors interconnected to the decoupling capacitors.

In accordance with a second aspect of the present invention there is provided a method of fabricating a substrate for power decoupling, the method comprising the steps of providing one or more decoupling capacitors; and forming one or more interconnections to the decoupling capacitors in the substrate; at least one of the interconnections comprising a lossy material.

One or more of the interconnections may be formed in different segments made from lossy and conductive materials respectively.

The different segments may be connected in series.

The interconnections may comprise vertical vias.

The method may comprise mounting an active device on a surface of the substrate, and each vertical via may interconnect directly to respective decoupling capacitors and the active device.

One or more of the interconnections may be directly connected to a power plane of the substrate.

One or more of the interconnections may be directly connected to a ground plane of the substrate.

The interconnections may be isolated from a power plane of the substrate.

Each decoupling capacitor may comprise a surface mounted discrete capacitor or an embedded discrete capacitor.

The method may further comprise forming one or more embedded integral capacitors in the substrate interconnected to the decoupling capacitors.

The interconnections may be formed utilizing photolithography, printing, filling, dispensing or jetting.

The method may comprise utilizing LTCC processing techniques.

The method may comprise utilizing organic processing techniques.

The method may comprise utilizing ceramic processing techniques.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Embodiments of the invention provide interconnection to decoupling capacitors and system level integration with discrete capacitors, embedded integral capacitors, embedded discrete capacitors, active devices, or any combination of one or more of the before mentioned components.

Figure 1:
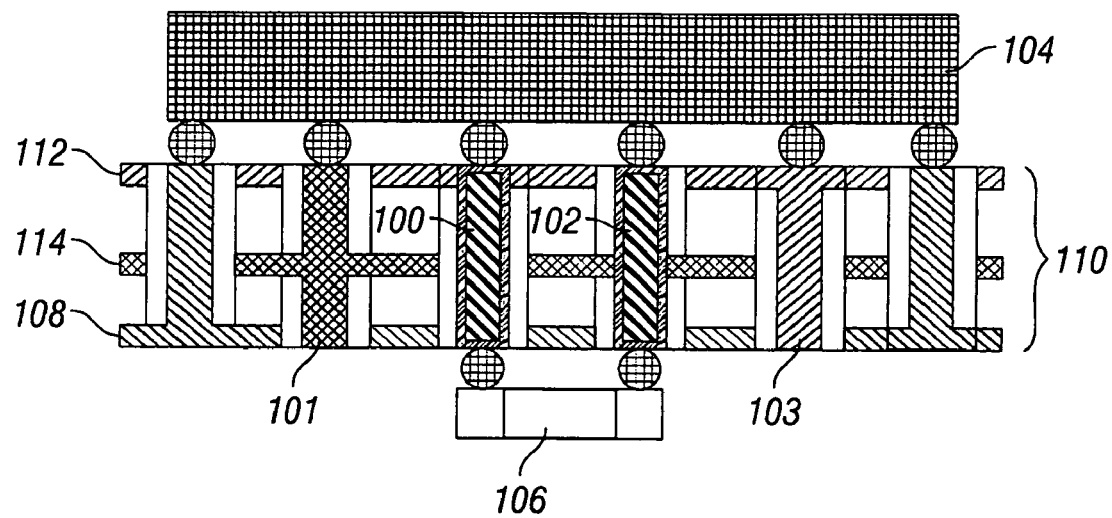
FIG. 1 is a schematic cross-sectional view of a substrate according to an embodiment of the present invention.

FIG. 1 shows an embodiment of a discrete decoupling capacitor 106 interconnection where lossy vias 100,102 are used to vertically interconnect to an active device 104. The lossy vias 100,102 can be formed using e.g. electrolytic plating, electroless plating, printing, filling, jetting or dispensing, either using separately processed via segments within different layers or as a contiguous via segment. The materials can consist of but are not limited to the following examples:

Electrolytic plating and electroless plating techniques: thin-wall or low conductivity metal or metal composite Thick-film printing, filling, jetting or dispensing techniques: Polymer based thick-film paste such as carbon composites and ceramic based thick film paste such as metal oxide composites.

The vias 100,102 provide low inductance interconnection between the discrete decoupling capacitor 106 and the active device 104, whilst simultaneously providing controllable lossy characteristics for via interconnection, thereby providing resonance damping. The controllable lossy characteristics, damping characteristics, or both may be determined at the design stage prior to fabrication and realized by a combination of geometry, selection of materials and processes. An internal signal layer 108 for high-speed routing is also formed in the substrate structure 110. In this embodiment, the via 100 is connected to a top power plane 112, and the via 102 is connected to an internal ground plane 114. Another via 101 interconnects the ground plane 114 to the active device 104, and the via 103 interconnects the power plane 112 to the active device 104.

Figure 2:
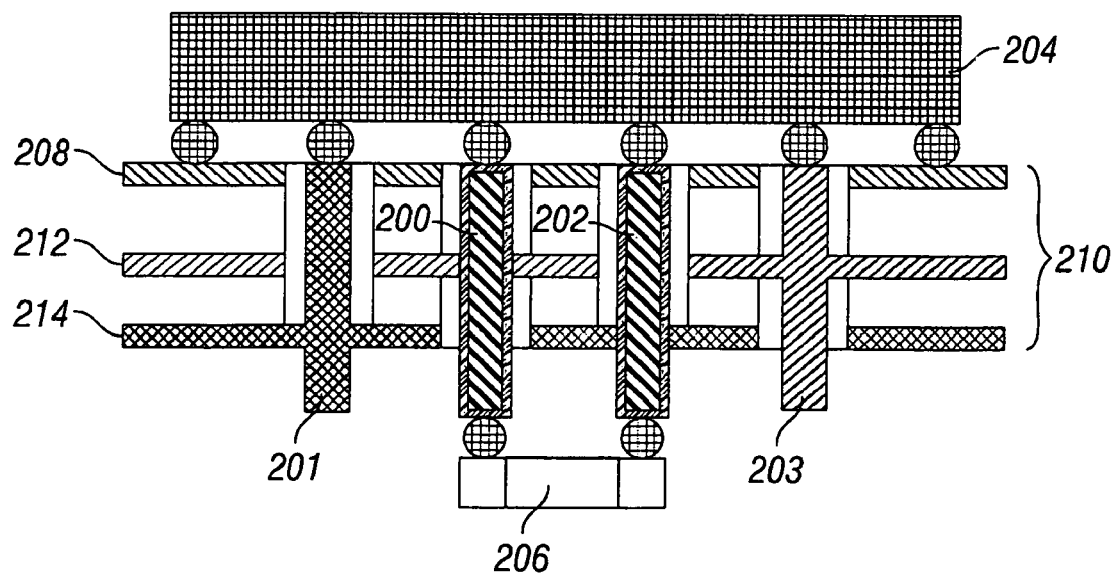
FIG. 2 is a schematic cross-sectional view of a substrate according to an embodiment of the present invention.

FIG. 2 shows an embodiment of the discrete decoupling capacitor 206 interconnection where homogeneously lossy vias 200, 202 are used to vertically interconnect to an active device 204, similar to FIG. 1. The lossy vias 200, 202 can be formed using e.g. electrolytic plating, electroless plating, printing, filling, jetting or dispensing, either using separately processed via segments within different layers or as a contiguous via segment. The vias 200, 202 provide low inductance interconnection between the discrete decoupling capacitor 206 and the active device 204, whilst simultaneously providing controllable lossy characteristics for via interconnection, thereby providing resonance damping. A top signal layer 208 for high-speed routing is also formed in the substrate structure 210. In this embodiment, the via 200 is connected to an internal power plane 212, and the via 202 is connected to an internal ground plane 214. Another via 201 interconnects the ground plane 214 with the active device 204, and the via 203 interconnects the power plane 212 to the active device 204. In FIG. 2, the via extension beyond the ground plane 214 illustrates connectivity to external layers (not shown).

Figure 3:
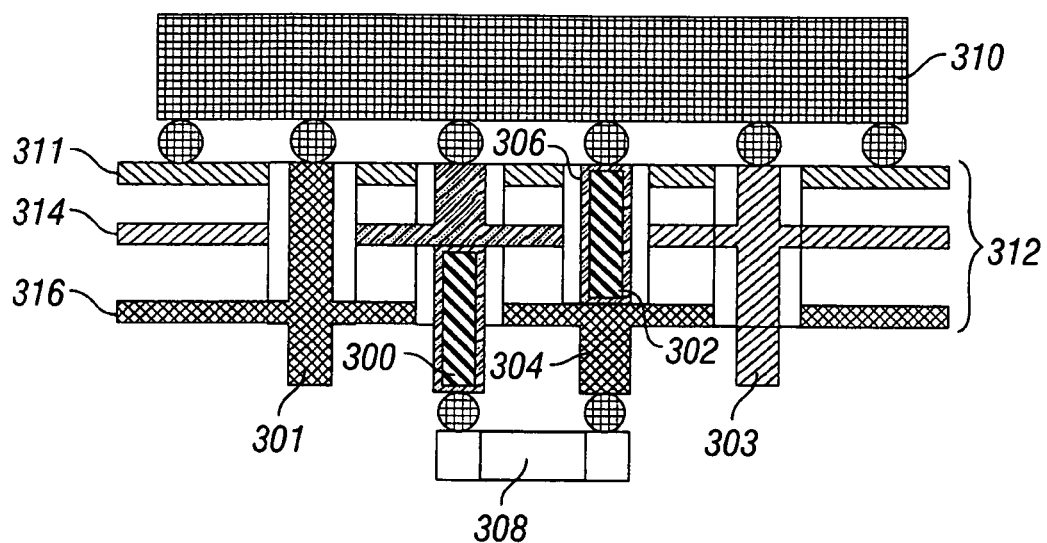
FIG. 3 is a schematic cross-sectional view of a substrate according to an embodiment of the present invention.

FIG. 3 shows an alternative embodiment in which vias 300, 302 are formed using multiple materials e.g. 304, 306, conductive and lossy respectively. The vias 300, 302 can be formed using e.g. electrolytic plating, electroless plating, printing, filling, jetting or dispensing, using separately processed via segments at least between the different material layers e.g. 304, 306 of the vias 300, 302. However, it will be appreciated that each material layer e.g. 304, 306 may also be processed via segments within different layers or as a contiguous via segment in different embodiments. The vias 300, 302 provide low inductance interconnection between the discrete decoupling capacitor 308 and an active device 310, whilst simultaneously providing controllable lossy characteristics for via interconnection, thereby providing resonance damping. A top signal layer 311 for high-speed routing is also formed in the substrate structure 312. In this embodiment, the via 306 is connected to an internal power plane 314, and the via 302 is connected to an internal ground plane 316. Another via 301 interconnects the ground plane 316 to the active device 310, and the via 303 interconnects the internal power plane 314 to the active device 204.

Figure 4:
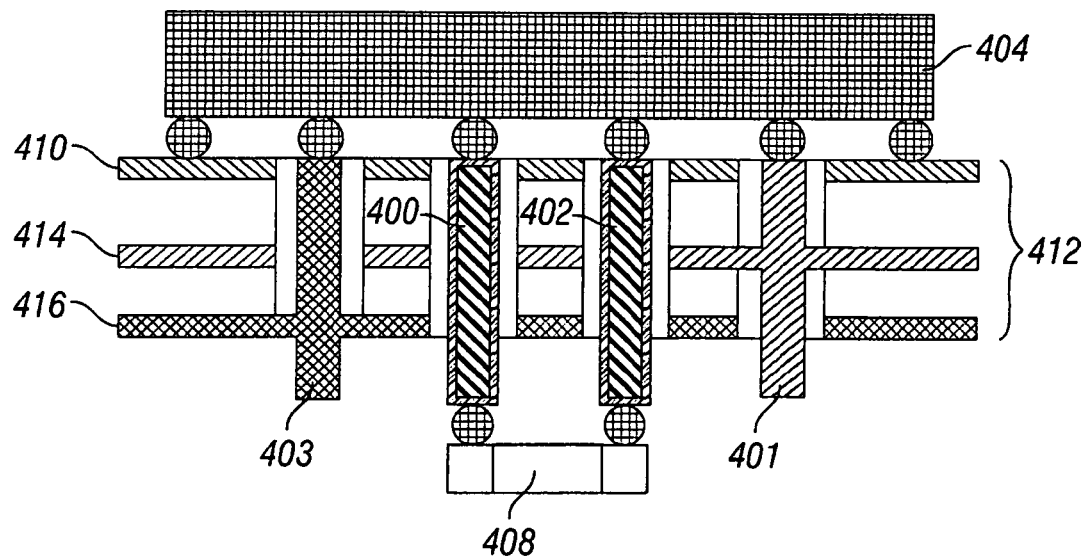
FIG. 4 is a schematic cross-sectional view of a substrate according to an embodiment of the present invention.

FIG. 4 shows an alternative embodiment in which homogeneously lossy vias 400, 402 are used to vertically interconnect a discrete decoupling capacitor 408 to an active device 404. The lossy vias 400, 402 can be formed using e.g. electrolytic plating, electroless plating, printing, filling, jetting or dispensing, either using separately processed via segments within different layers or as a contiguous via segment. The vias 400, 402 are isolated from the power plane 414 and ground plane 416, respectively, and are for high frequency decoupling. Another via 401 interconnects the internal power plane 414 to the active device 404, and the via 403 interconnects the ground plane 414 to the active device 404. The vias 400, 402 provide low inductance interconnection between the discrete decoupling capacitor 408 and the active device 404, whilst simultaneously providing controllable lossy characteristics for via interconnection, thereby providing resonance damping. A top signal layer 410 for high-speed routing is also formed in the substrate structure 412.

Figure 5:
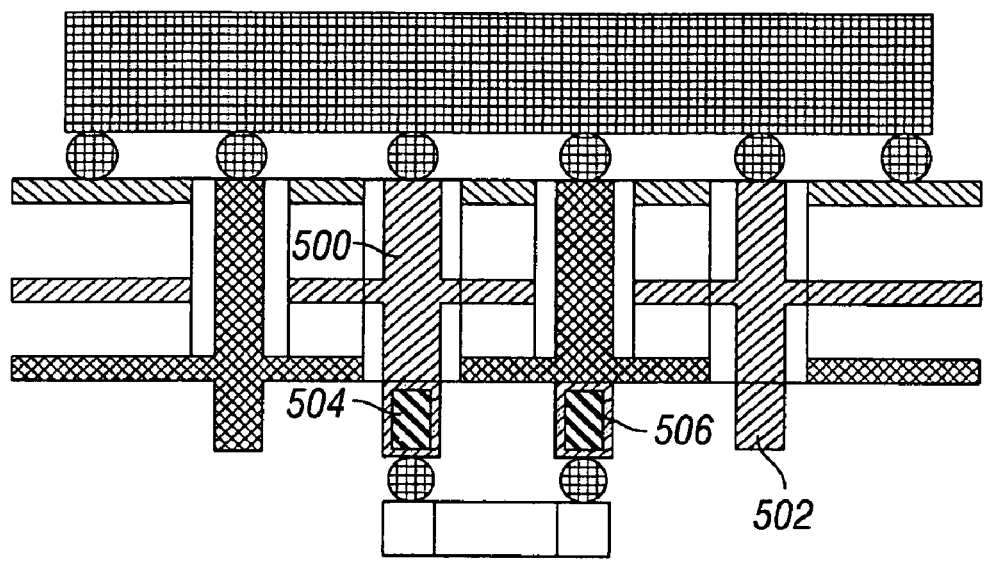
FIG. 5 is a schematic cross-sectional view of a substrate according to an embodiment of the present invention.
Figure 6:
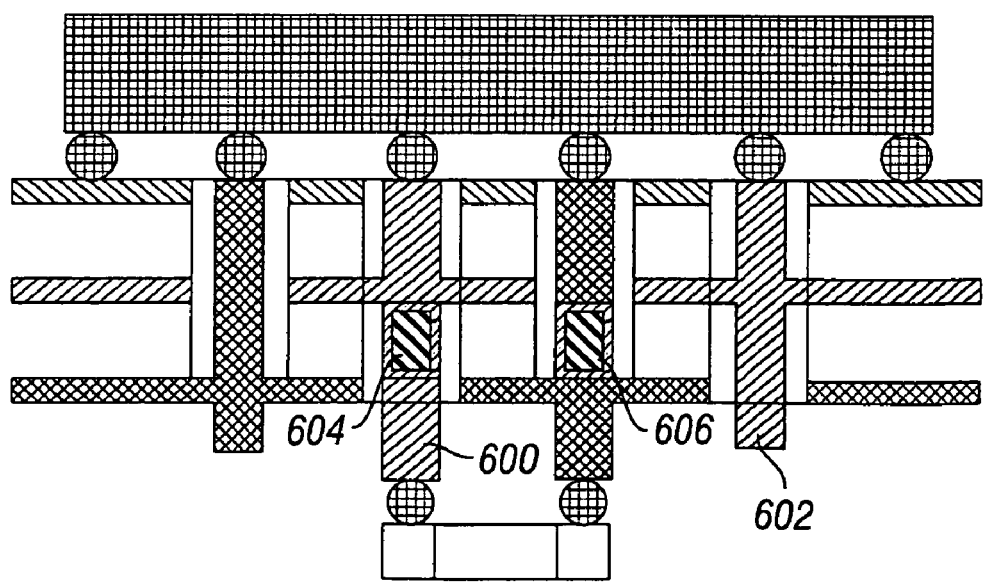
FIG. 6 is a schematic cross-sectional view of a substrate according to an embodiment of the present invention.
Figure 7:
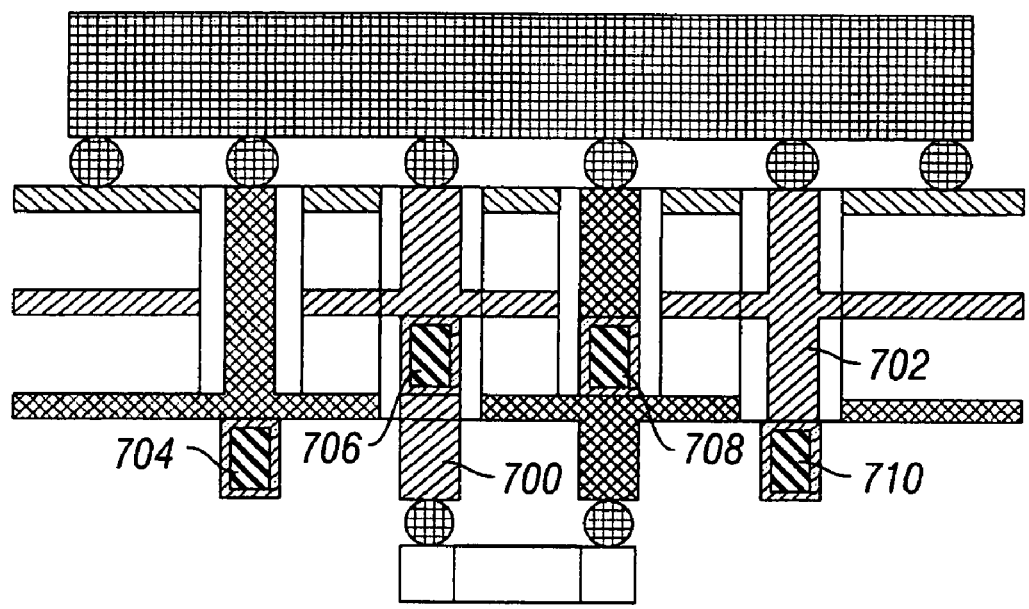
FIG. 7 is a schematic cross-sectional view of a substrate according to an embodiment of the present invention.
Figure 8:
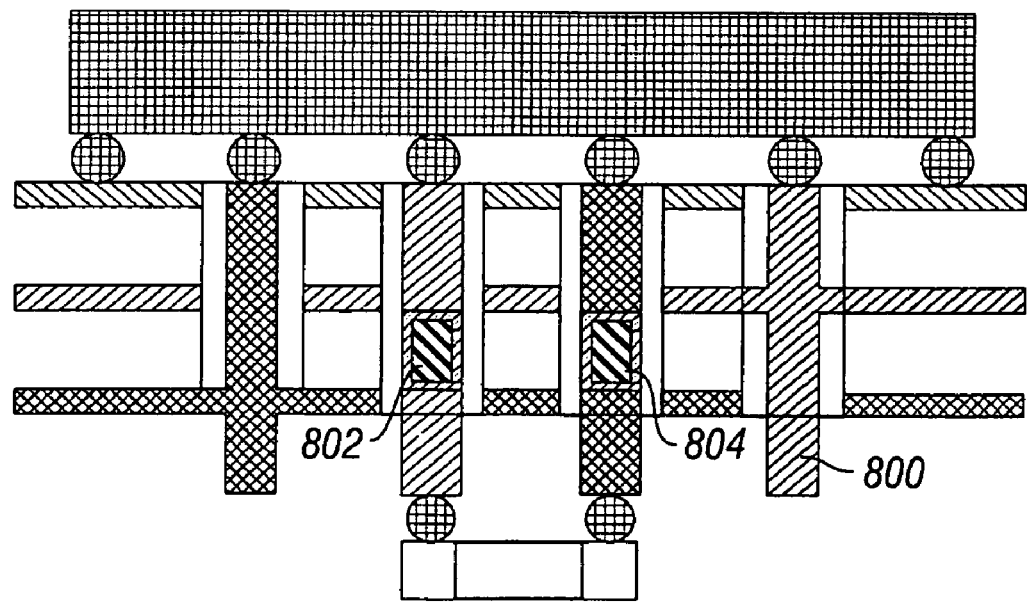
FIG. 8 is a schematic cross-sectional view of a substrate according to an embodiment of the present invention.
Figure 9:
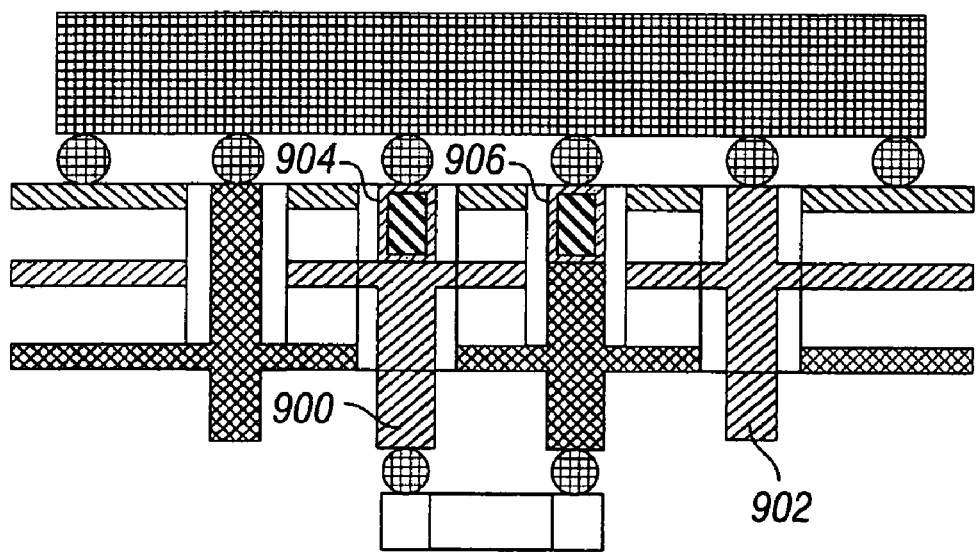
FIG. 9 is a schematic cross-sectional view of a substrate according to an embodiment of the present invention.
Figure 10:
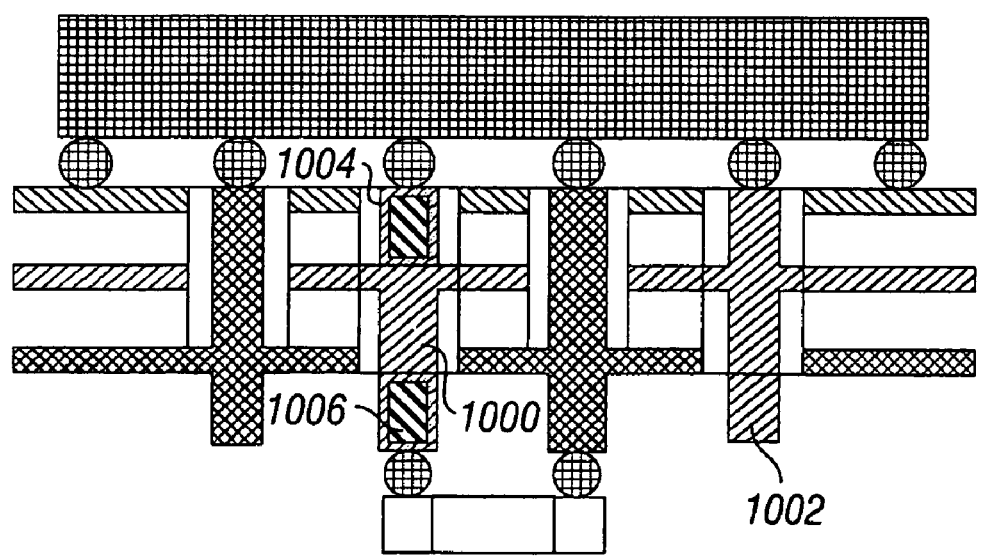
FIG. 10 is a schematic cross-sectional view of a substrate according to an embodiment of the present invention.

FIGS. 5 to 10 show alternative embodiments of discrete decoupling capacitor interconnection for different fabrication processes and to achieve low inductance interconnection design flexibility. FIG. 5 shows multiple power plane connections through vias 500 and 502, and lossy via segments 504, 506. FIG. 6 shows multiple power plane connections through vias 600 and 602, and lossy via segments 604, 606. FIG. 7 shows multiple power plane connections through vias 700 and 702, and lossy via segments 704, 706, 708, and 710. FIG. 8 shows a single power plane connection through 800, and lossy via segments 802, 804. FIG. 9 shows multiple power plane connections through vias 900 and 902, and lossy via segments 904, 906. FIG. 10 shows multiple power plane connections through vias 1000 and 1002, and lossy via segments 1004, 1006.

Figure 11:
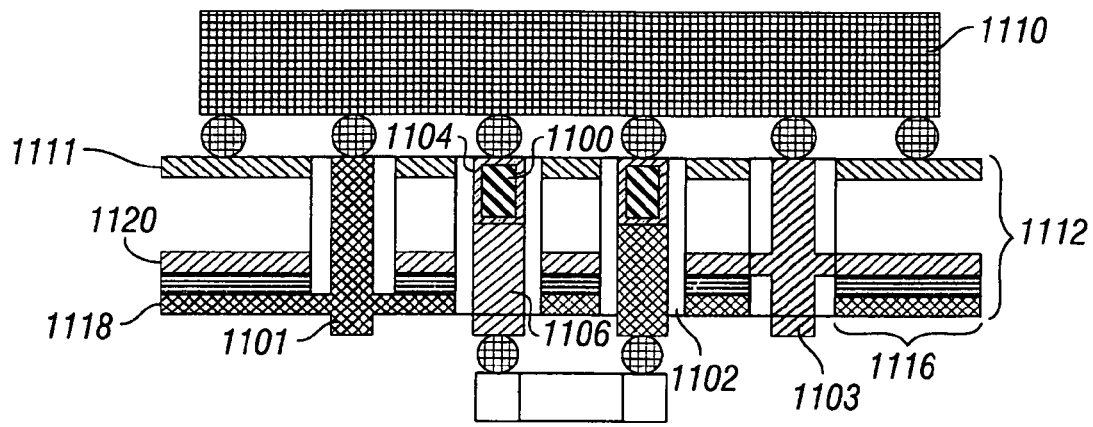
FIG. 11 is a schematic cross-sectional view of a substrate according to an embodiment of the present invention.

FIG. 11 shows an alternative embodiment in which vias 1100, 1102 are formed using multiple materials e.g. 1104, 1106, conductive and lossy respectively. The vias 1100, 1102 can be formed using e.g. electrolytic plating, electroless plating, printing, feeding, jetting or dispensing, using separately processed via segments at least between the different material layers e.g. 1104, 1106 of the vias 1100, 1102. However, it will be appreciated that each material layer e.g. 1104, 1106 may also be processed via segments within different layers or as a contiguous via segment in different embodiments. The vias 1100, 1102 provide low inductance interconnection between the discrete decoupling capacitor 1108 and an active device 1110, while simultaneously providing controllable lossy characteristics for via interconnection, thereby providing resonance damping. A top signal layer 1111 for high-speed routing is also formed in the substrate structure 1112.

The substrate structure 1112 in this embodiment further includes a high dielectric constant material layer 1113 formed between the power plane 1120 and ground plane 1118. It will be appreciated by a person skilled in the art that in the substrate structure 1112 in this embodiment, embedded capacitor structures e.g. 1116 are formed and thus a power decoupling network integrating discrete capacitors e.g. 1108 with embedded capacitors e.g. 1116 is provided. In the embodiment shown in FIG. 11, the vias 1100, 1102 are isolated from the ground and power planes 1118, 1120 respectively. Another via 1101 interconnects the ground plane 1118 to the active device 1110, and the via 1103 interconnects the internal power plane 1120 to the active device 1110.

Figure 12:
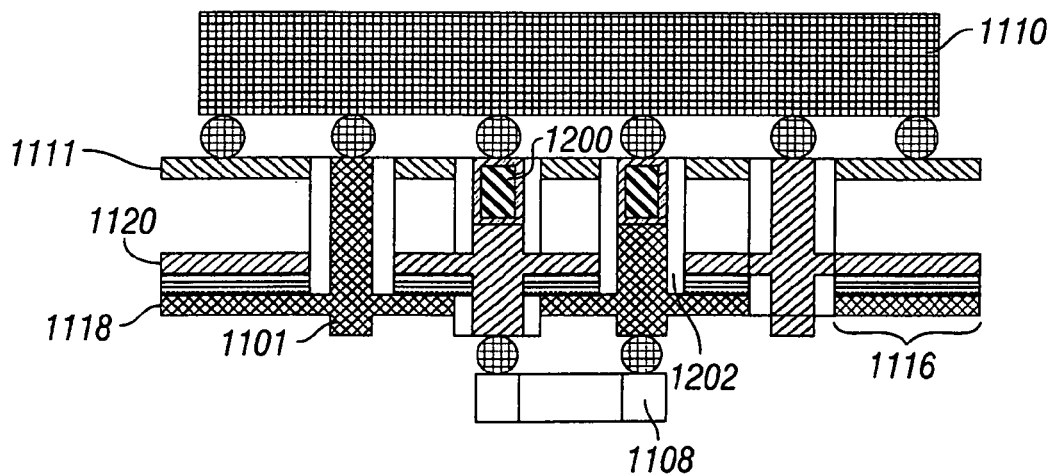
FIG. 12 is a schematic cross-sectional view of a substrate according to an embodiment of the present invention.

In the embodiment shown in FIG. 12, one of the vias 1200 is connected to the power plane 1120 whereas the other via 1202 is connected to the ground plane 1118. Otherwise, FIG. 12 is identical to FIG. 11, and the same reference numerals have been used for the same elements or features.

Figure 13:
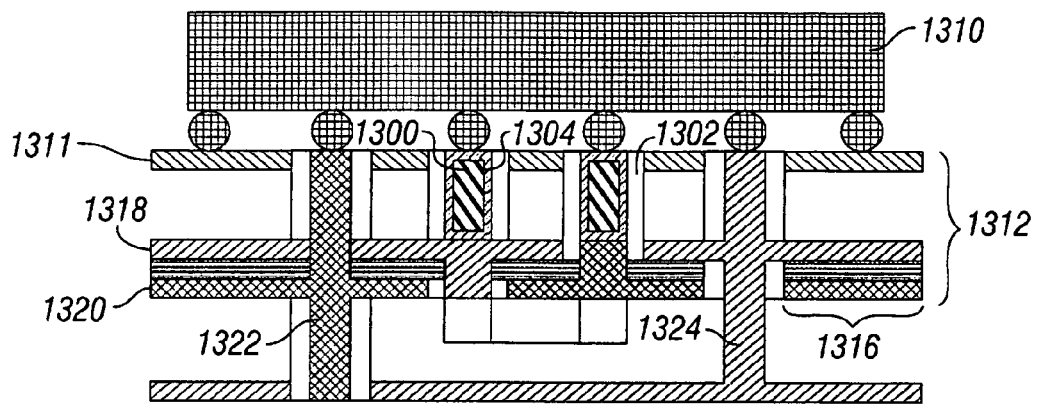
FIG. 13 is a schematic cross-sectional view of a substrate according to an embodiment of the present invention.

FIG. 13 shows an alternative embodiment in which vias 1300, 1302 are formed using multiple materials e.g. 1304, 1306, conductive and lossy respectively. The vias 1300, 1302 can be formed using e.g. electrolytic plating, electroless plating, printing, filling, jetting or dispensing, using separately processed via segments at least between the different material layers e.g. 1304, 1306 of the vias 1300, 1302. However, it will be appreciated that each material layer e.g. 1304, 1306 may also be processed via segments within different layers or as a contiguous via segment in different embodiments. Via 1300 is connected to the power plane 1318 whereas via 1302 is connected to the ground plane 1320. Additional ground plane 1320 and power plane 1318, 1326 interconnections are provided through vias 1322 and 1324 respectively. In this embodiment, multiple power planes 1318, 1326 are provided. Multiple power planes can be used to improve the power distribution characteristics and also to provide additional reference planes for high-speed signal routing.

The vias 1300, 1302 provide low inductance interconnection between an embedded discrete decoupling capacitor 1308 and an active device 1310, while simultaneously providing controllable lossy characteristics for via interconnection, thereby providing resonance damping. A top signal layer 1311 for high-speed routing is also formed in the substrate structure 1312. The substrate structure 1312 in this embodiment further includes a high dielectric constant material layer 1313 formed between the power plane 1318 and ground plane 1320. It will be appreciated by a person skilled in the art that in the substrate structure 1312 in this embodiment, embedded integral capacitor structures e.g. 1316 are formed and thus a power decoupling network integrating embedded discrete capacitors e.g. 1308 with embedded integral capacitors e.g. 1316 is provided.

It will be appreciated by the person skilled in the art that the embodiments in FIGS. 1 to 13 can be realized by, but not limited to, printed circuit board fabrication, build-up organic substrate fabrication, thick-film substrate fabrication and low-temperature co-fired ceramic substrate fabrication.

Fabrication of a substrate structure for power decoupling in electronic appliances and systems according to an example embodiment is described hereinafter, using organic substrate or printed circuit board manufacturing processes.

Figure 14:
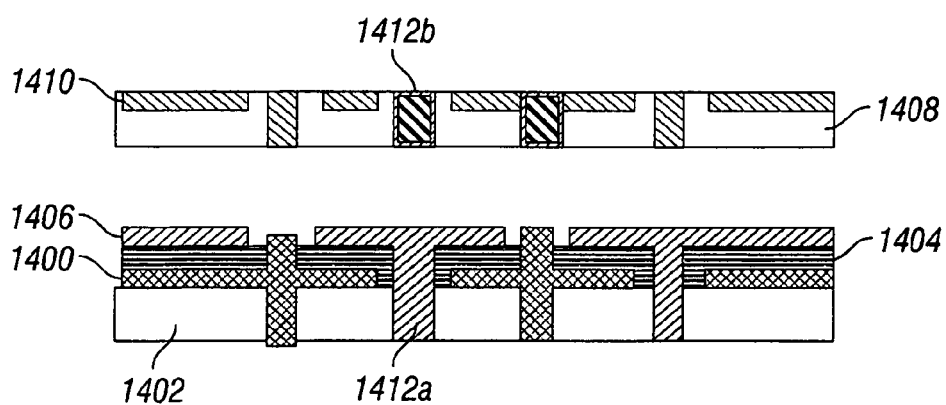
FIG. 14 is a schematic cross-sectional view of substrate components during a method of forming a substrate according to an embodiment of the present invention.

In FIG. 14, a pattern for a ground plane 1400 is formed on a laminate 1402. The materials for the ground plane 1400 can comprise, but are not limited to, metal foils already pre-laminated on the laminate 1402, and may comprise copper in the example embodiment. The laminate 1402 can comprise, but is not limited to, BT, FR4, glass-epoxy and organic based materials. Via segments e.g. 1412(*a*) are formed in the laminate 1402 using mechanical drilling, laser drilling, or other known techniques followed by electrolytic plating, electroless plating, printing, filling, jetting or dispensing or other known techniques. Next, a high dielectric constant material is deposited by printing, spin coating, or other known techniques to form a dielectric layer 1404 for the embedded capacitors to be formed. The high dielectric constant material can comprise ceramic filled polymer such as Barium Titanate composite paste that can be spin coated or screen printed and cured at temperature below about 250° C., achieving compatibility with organic substrates in the example embodiment. The ceramic fillers are used to increase the dielectric constant of the paste in the example embodiment. Next, the power plane 1406 is formed by printing, or other known techniques.

Another laminate 1408, typically a B-stage prepreg or resin coated copper, is provided, having formed thereon a signal plane 1410. The materials for the signal plane 1410 can comprise, but are not limited to, metal foils already pre-laminated on the laminate 1408 and may comprise copper, in the example embodiment. The laminate 1408 can comprise of organic based materials. Via segments e.g. 1412(*b*) in laminate 1408 are then formed using mechanical drilling, laser drilling, or other known techniques followed by printing, filling, jetting or dispensing or other known techniques.

Figure 15:
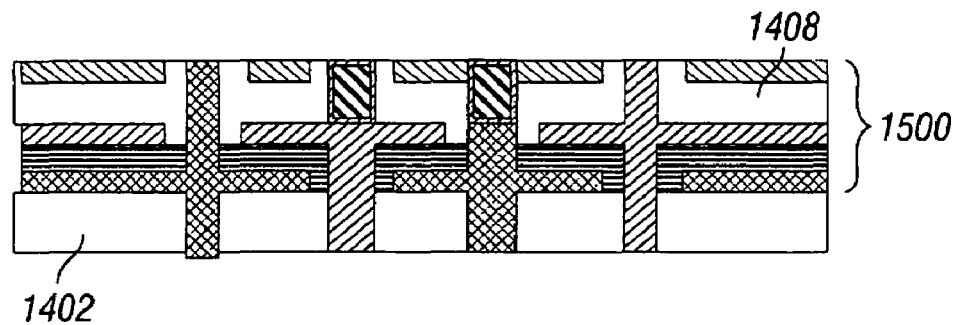
FIG. 15 is a schematic cross-sectional view of a substrate formed according to an embodiment of the present invention.
Figure 16:
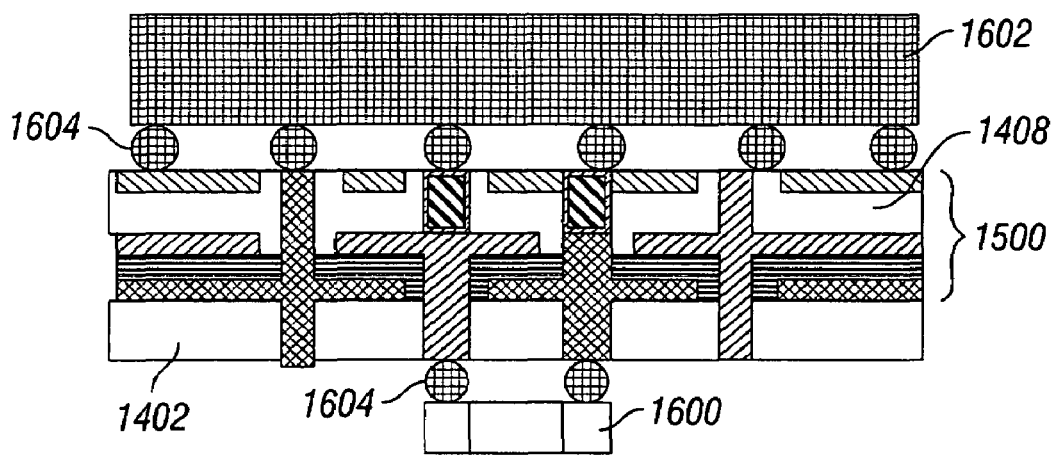
FIG. 16 is a schematic cross-sectional view of a substrate formed according to an embodiment of the present invention, integrated with a discrete decoupling capacitor and IC.

The laminates 1402 and 1408 are than aligned and laminated, forming the substrate structure 1500 as shown in FIG. 15. Finally, to form a subsystem, as shown in FIG. 16, a discrete capacitor 1600 and an active device in the form of IC 1602 in the example embodiment are interconnected with the substrate structure 1500, using solder ball connections e.g. 1604 in the example embodiment.

While the fabrication processes described above with reference to FIGS. 14 to 16 are based on organic processes, it will be appreciated by a person skilled in the art that other fabrication processes may be used in different embodiments, including, but not limited to, ceramic and low temperature co-fired ceramic (LTCC) manufacturing processes. In an LTCC embodiment, the signal, power, and ground planes may be formed by printing, spin coating or other known techniques onto ceramic tape layers. The via holes may be formed by drilling of the ceramic tape layers or mechanical punching of the tape layers and followed by filling with the relevant materials. The overall LTCC substrate structure may then be formed by laminating together the ceramic tape layers at room temperature followed by iso-static pressure applied at temperatures to about 90° C. The substrate structure is then fired in a furnace at temperatures between about 750° C. to about 900° C. Through the debinding and sintering processes, the multiple layers are bonded and integrated together.

Figure 17:
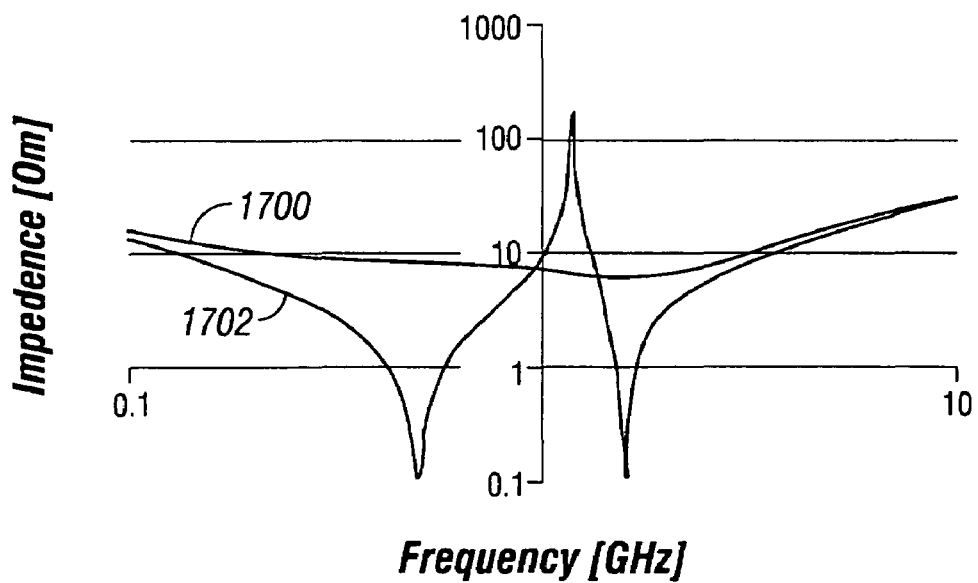
FIG. 17 shows a plot of impedance versus frequency illustrating a comparison between a power decoupling substrate according to an embodiment of the invention and a conventional power decoupling substrate.

FIG. 17 shows impedance versus frequency characteristics illustrating a comparison between a power decoupling substrate according to an embodiment of the invention (curve 1700) and a conventional power decoupling substrate (curve 1702). As can be seen from FIG. 17, the example embodiment of the invention can provide design flexibility for performance optimization without or with a reduced additional space or volume requirement within the substrate, thereby offering "plug and play" integration in system design. Furthermore, example embodiments can achieve resonance damping and reduced or minimum loop inductance simultaneously, thereby extending the operating frequency and reducing the power distribution impedance, whilst providing low impedance to high current distribution.

Advantages of embodiments of the invention may include:

- Implementation is compatible with a large variety of substrate fabrication techniques and materials, including but not limited to organic, ceramic and LTCC materials.
- Design flexibility for performance optimization without or with a reduced additional space or volume requirement within the substrate, thereby offering "plug and play" integration in system design,
- Achievement of resonance damping and reduced or minimum loop inductance simultaneously, thereby extending the operating frequency and reducing the power distribution impedance, whilst providing low impedance to high current distribution.
- High current distribution in power planes is unaffected by lossy elements in vias.
- Thermal conductivity in power planes is unaffected by lossy elements in vias.
- Electro magnetic interference (EMI) shielding in power planes is unaffected by lossy elements in vias and still provided by highly conductive planes.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A substrate for power decoupling, comprising:
   one or more decoupling capacitors; and
   one or more vertical via interconnections to the decoupling capacitors, at least one of the vertical via interconnections comprising vertically stacked segments made from lossy and conductive materials, such that a current flow through the vertical via is orthogonal with respect to a power or ground plane of the substrate, and such that said current flow is in series through the lossy and conductive materials.

2. The substrate as claimed in claim 1, further comprising an active device mounted on a surface of the substrate, and wherein each vertical via interconnection interconnects directly to respective decoupling capacitors and the active device.

3. The substrate as claimed in claim 1, wherein one or more of the vertical via interconnections are directly connected to a power plane of the substrate.

4. The substrate as claimed in claim 1, wherein one or more of the vertical via interconnections are directly connected to a ground plane of the substrate.

5. The substrate as claimed in claim 1, wherein the vertical via interconnections are isolated from a power plane of the substrate.

6. The substrate as claimed in claim 1, wherein each decoupling capacitor comprises a surface mounted discrete capacitor or an embedded discrete capacitor.

7. The substrate as claimed in claim 1, further comprising one or more embedded integral capacitors interconnected to the decoupling capacitors.

8. A method of fabricating a substrate for power decoupling, the method comprising the steps of:
   providing one or more decoupling capacitors; and
   forming one or more vertical via interconnections to the decoupling capacitors in the substrate, at least one of the vertical via interconnections comprising vertically stacked segments made from lossy and conductive materials such that a current flow through the vertical via is orthogonal with respect to a power or ground plane of the substrate, and such that said current flow is in series through the lossy and conductive materials.

9. The method as claimed in claim 8, further comprising mounting an active device on a surface of the substrate, and wherein each vertical via interconnects directly to respective decoupling capacitors and the active device.

10. The method as claimed in claim 8, wherein one or more of the vertical via interconnections are directly connected to a power plane of the substrate.

11. The method as claimed in claim 8, wherein one or more of the vertical via interconnections are directly connected to a ground plane of the substrate.

12. The method as claimed in claim 8, wherein the vertical via interconnections are isolated from a power plane of the substrate.

13. The method as claimed in claim 8, wherein each decoupling capacitor comprises a surface mounted discrete capacitor or an embedded discrete capacitor.

14. The method as claimed in claim 8, further comprising forming one or more embedded integral capacitors in the substrate interconnected to the decoupling capacitors.

15. The method as claimed in claim 8, wherein the vertical via interconnections are formed utilizing photolithography, printing, filling, dispensing or jetting.

16. The method as claimed in claim 8, comprising utilizing LTCC processing techniques.

17. The method as claimed in claim 8, comprising utilizing organic processing techniques.

18. The method as claimed in claim 8, comprising utilizing ceramic processing techniques.

19. A substrate for power decoupling, comprising:
   one or more decoupling capacitors; and
   one or more vertical via interconnections to the decoupling capacitors, at least one of the vertical via interconnections comprising a lossy material.

20. A method of fabricating a substrate for power decoupling, the method comprising the steps of:
   providing one or more decoupling capacitors; and
   forming one or more vertical via interconnections to the decoupling capacitors in the substrate, at least one of the vertical via interconnections comprising a lossy material.

* * * * *